United States Patent [19]
Djennas et al.

[11] Patent Number: 5,233,222
[45] Date of Patent: Aug. 3, 1993

[54] SEMICONDUCTOR DEVICE HAVING WINDOW-FRAME FLAG WITH TAPERED EDGE IN OPENING

[75] Inventors: Frank Djennas; Alan H. Woosley, both of Austin, Tex.

[73] Assignee: Motorola, Inc., Schaumburg, Ill.

[21] Appl. No.: 919,442

[22] Filed: Jul. 27, 1992

[51] Int. Cl.⁵ .............................. H01L 23/12
[52] U.S. Cl. ......................... 257/676; 257/666
[58] Field of Search .......... 357/70; 257/676, 669, 257/666

[56] References Cited

U.S. PATENT DOCUMENTS

| | | | |
|---|---|---|---|
| 4,797,726 | 1/1989 | Manabe et al. | 357/70 |
| 4,862,246 | 8/1989 | Masuda et al. | 357/70 |
| 4,884,124 | 11/1989 | Mori et al. | 357/70 |
| 4,918,511 | 4/1990 | Brown | 357/70 |
| 4,924,291 | 5/1990 | Lesk et al. | 357/70 |
| 4,942,452 | 7/1990 | Kitano et al. | 357/70 |
| 4,994,895 | 2/1991 | Matsuzaki et al. | 357/72 |
| 5,150,193 | 9/1992 | Yasuhara et al. | 357/70 |

FOREIGN PATENT DOCUMENTS

| | | |
|---|---|---|
| 62-283648 | 12/1987 | Japan . |
| 63-81965 | 4/1988 | Japan . |
| 1-111318 | 4/1989 | Japan . |
| 2-194640 | 8/1990 | Japan . |
| 3-11754 | 1/1991 | Japan . |

*Primary Examiner*—Rolf Hille
*Assistant Examiner*—S. V. Clark
*Attorney, Agent, or Firm*—Patricia S. Goddard

[57] ABSTRACT

A semiconductor device (30) utilizes a lead frame (32) having a window-frame flag (36). An opening (44) within the flag creates an interior edge (46) which is tapered, preferably to an angle φ that is between 55° and 65°. The tapered interior edge reduces boundary-layer separation of a resin molding compound during formation of a resin package body (42). Thus, voids in the resin packaging material near the interior edge of the flag are less likely to be formed.

15 Claims, 5 Drawing Sheets

SEMICONDUCTOR DEVICE HAVING WINDOW-FRAME FLAG WITH TAPERED EDGE IN OPENING

FIELD OF THE INVENTION

The present invention relates to semiconductor devices in general, and more specifically to semiconductor devices that employ lead frames having a window-frame flag.

BACKGROUND OF THE INVENTION

Semiconductor devices packaged in plastic or resin packages typically include portions of a lead frame. More specifically, each device includes a plurality of leads electrically coupled to a semiconductor die and a die support member on which the die is mounted. Throughout the industry, the die support member has many names. For the purposes of the present invention, the die support plate will be referred to as a flag. Many existing flags of semiconductor devices are in the form of a solid plate that is slightly larger in area that the semiconductor die and made of the same material as remaining portions of the lead frame, for instance, copper, a copper alloy, iron-nickel alloys, clad materials, and the like.

A problem with conventional plate-type flags is poor adhesion at an interface of the flag and the plastic package material. As a result of this weak interface, the plastic package material can easily separate from the flag leaving an air gap. Such an air gap becomes problematic upon mounting the device to a user substrate using conventional surface mounting techniques. Surface mounting techniques involve elevated temperatures that cause the air gap, which also may contain moisture, to expand. Stress built up in the package as a result of the air and moisture expansion is relieved by way of the formation of cracks in the plastic package body. Cracks in a package body are a path for contaminants to reach the semiconductor die, and therefore are a significant reliability problem.

Another problem associated with conventional plate-type flag is poor adhesion between the flag and conventional adhesive epoxies used to attach a semiconductor die to the flag. A die attach epoxy is generally dispensed onto the flag of a lead frame. Upon bonding a semiconductor die to the flag, the epoxy is dispersed, such that the epoxy forms a thin, continuous region beneath the entire die. While the epoxy typically bonds well to a surface of the die, the adhesion between the epoxy and flag is not as strong. Therefore, under certain stress conditions, there is a tendency for delamination between the die and the flag to occur. Such delamination raises reliability issues.

One solution, or at least improvement, to the package cracking phenomenon and to the problem of delamination between the flag and the die is the use of a window-frame flag. Rather than using a solid plate, a flag is shaped like a window-frame or ring having a central opening. Like the flag, the opening is square or rectangular to match the shape of a semiconductor die. The semiconductor die is mounted onto the frame flag, covering the opening. Ideally, the opening is as large as possible so that a maximum area of a surface of the die is exposed by the opening. Upon encapsulating the die and flag with a plastic package material, the portion of the die exposed through the opening in the flag is in contact with the plastic package material. The conventional lead frame and packaging materials used in semiconductor manufacturing are such that adhesion between a semiconductor die surface and a plastic package material is stronger than adhesion between a lead frame material and the plastic package material. The use of a window-frame flag reduces the possibility of forming an air gap in a package, and hence of forming cracks, since the area of an interface between the flag and package material is reduced in comparison to using a plate-type flag.

Although use of window-frame flags aids in resolving the problem of package cracking, the use of these flags leads to another problem associated with semiconductor packaging. In particular, a conventional window-frame flag creates an unacceptable potential for void formation during the encapsulation process. The voiding problem is explained below in reference to FIGS. 1 and 2.

Illustrated in FIG. 1 is a cross-sectional view of a mold tool 10 having an upper platen 12 and a lower platen 14. Mold tools, such as mold tool 10, are commonly used in the industry to mold a resin or plastic package body around a semiconductor die. When brought together, the upper and lower platens form a cavity 16 that defines what is to be a package body. A lead frame 18 is positioned between the upper and lower platens of mold tool 10 in a conventional manner. Lead frame 18 has a plurality of leads 20 and a window-frame flag 22. Within window-frame flag 22 is an opening 24. Positioned on flag 22 is a semiconductor die 26. Die 26 is typically attached to the flag using an adhesive material (not illustrated), such as a silver-filled epoxy. The die is electrically coupled to lead 20 by conventional wire bonds 28.

Using mold tool 10 during a transfer molding process to form a package body requires introduction of a plastic modling compound, such as a thermosetting epoxy resin, into cavity 16. The resin may be introduced into the cavity either from the top of the mold, the bottom of the mold, or from the side. Respectively, these molding operations are known as top-gating, bottom-gating, and side-gating. Regardless of where the resin is introduced into cavity 16, the resin must flow throughout the cavity in order to completely encapsulate semiconductor die 26, wire bonds 28, flag 22, and inner portions of leads 20. However, the frame shape of flag 22 impedes resin flow. FIG. 2 demonstrates, in an exploded view, resin flow near a flag region of lead frame 18 in mold tool 10 of FIG. 1. As a resin material 29 is introduced into cavity 16, the resin is diverted by die 26 and flag 22 so that a portion of the resin flows above the die and a portion flows below the die. Upon passing flag 22, the resin flowing below die 26 undergoes a boundary-layer separation, resulting in formation of a void or lack of resin in a region 32. The boundary-layer separation is a phenomenon associated with flow of a fluid perpendicular to a flat or sharp object. A void formed in a package body is similar to the delamination between a flag and a plastic package body in that both can lead to package cracking, and therefore both pose reliability concerns.

One method of avoiding void formation near interior edges of window-frame flags is to use a very slow curing, low-viscosity resin molding compound. During transfer molding operation, a mold tool is usually heated such that a thermosetting resin begins to cure and harden before encapsulation is complete. In using a slow-cure, low-viscosity mold compound, flow within a mold tool cavity is less restricted since it hardens gradually. However, a principal manufacturing goal of reducing cycle-time favors the use of fast-cure molding compounds. Therefore, another solution to the problem of void formation associated with using window-frame flags is needed.

SUMMARY OF THE INVENTION

The foregoing need is met, and other advantages are achieved, with the present invention. In one form, a semiconductor device includes a lead frame having a plurality of leads and a flag. The flag has an opening extending therethrough, an outer perimeter, and an inner perimeter defined by the opening. The inner perimeter of the flag has a tapered edge. A semiconductor die is positioned on the flag of the lead frame and is electrically coupled to the plurality of leads. A resin package body encapsulates the semiconductor die, the flag, the opening, and inner portions of the leads. Another form of the invention involves a method of making such a semiconductor device.

These and other features of the present invention, as well as the invention's advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

With the present invention, a window-frame flag can be used in a semiconductor device with a smaller likelihood of void formation as compared to existing window-frame devices. In accordance with the present invention, a lead frame flag includes a large opening that establishes a ring-like or frame-like flag, hereinafter referred to as a window-frame flag. The flag has an outer perimeter and has an inner perimeter that is defined by the opening. The inner perimeter of the flag has an edge that is outwardly tapered from the top of the flag to the bottom. The tapered edge of the flag's inner perimeter closely matches the flow of a resin molding compound such that void formation is less likely than if the inner perimeter included a perpendicular edge. In another form of the invention, the opening in the flag is made round or elliptic, thereby eliminating sharp corners and also reducing the chances of void formation.

Figure 3:
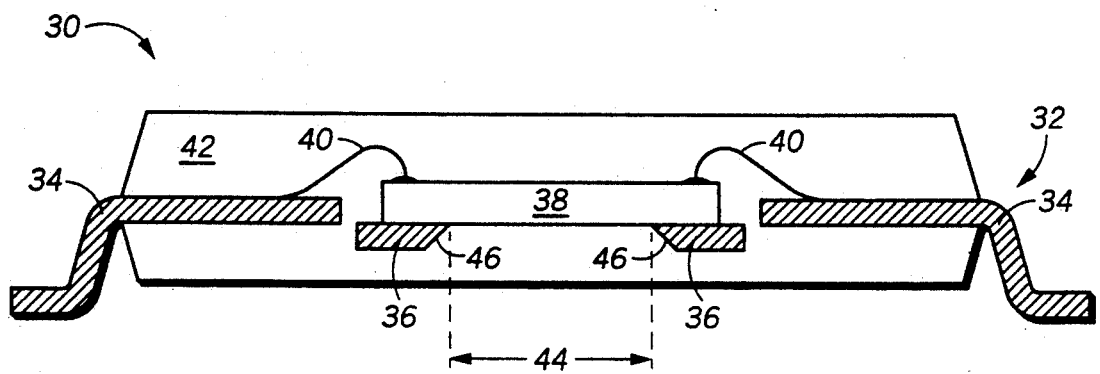
FIG. 3 is a cross-sectional view of a semiconductor device in accordance with the present invention.

The features mentioned above and the advantages of the present invention are more readily apparent with reference to the remaining figures. FIG. 3 illustrates, in a cross-sectional view, a semiconductor device 30 in accordance with the present invention. Device 30 includes portions of a lead frame 32, and more specifically includes a plurality of leads 34 and a window-frame flag 36. Attached to a top surface of flag 36 is a semiconductor die 38. Die 38 is typically an integrated circuit such as a microcontroller, microprocessor, memory, gate array, or the like. Die 38 is electrically coupled to leads 34 by wire bonds 40, although any available coupling method may be used in accordance with the present invention. For example, tape automated bonding (TAB) is also suitable. A resin package body 42 encapsulates die 38, wire bonds 40, and portions of lead frame 32.

Formed in flag 36 is an opening 44. Due to the presence of opening 44 and cross-sectional nature of FIG. 3, flag 36 appears to be discontinuous. However, as will become apparent in FIGS. 4-7, a flag in a device of the present invention is preferably a continuous ring. Opening 44 fixes the limits of an inner perimeter of flag 36. The inner perimeter of flag 36 includes a tapered edge 46. Edge 46 is tapered outwardly from a top surface to a bottom surface of flag 36. Edge 46 can be formed during lead frame manufacturing using known techniques, including, but not limited to, chemical etching and stamping, or combinations of known techniques.

Figure 1:
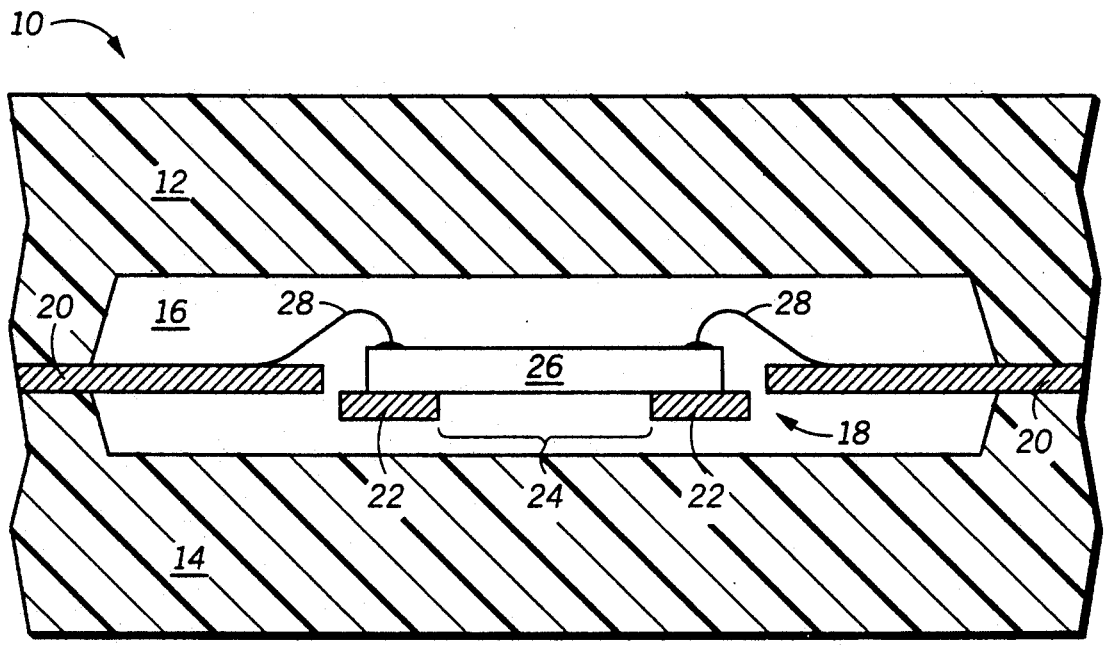
FIG. 1 is a cross-sectional view of a mold tool used to form a plastic package body about a semiconductor die mounted on a conventional lead frame using a known molding technique.
Figure 2:
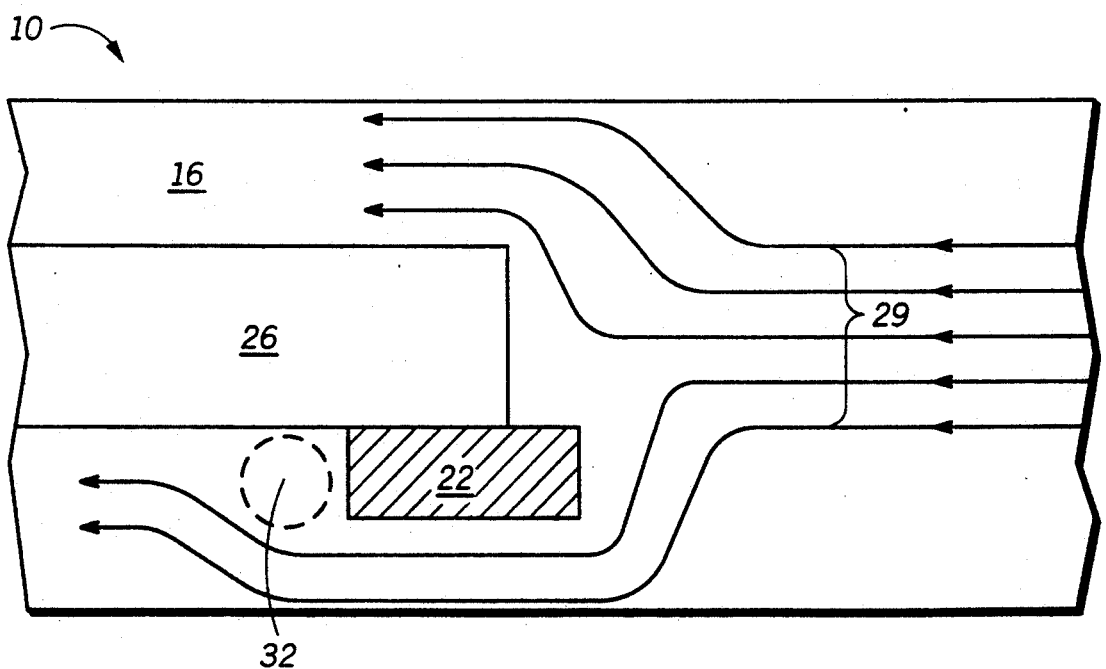
FIG. 2 is an exploded cross-sectional view demonstrating resin flow around the lead frame and semiconductor die of FIG. 1 during a molding operation.
Figure 4:
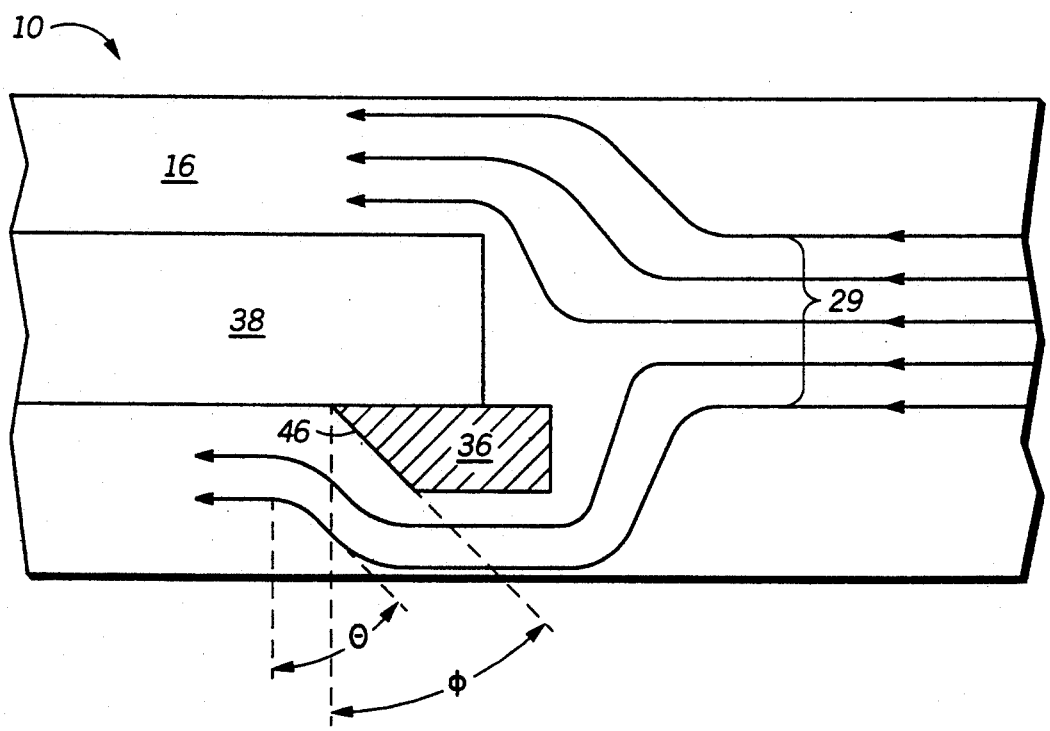
FIG. 4 is an exploded cross-sectional view demonstrating resin flow around the lead frame and semiconductor die of FIG. 3 during a molding operation.

FIG. 4 demonstrates how tapered edge 46 reduces the likelihood of voiding. FIG. 4 is an exploded cross-sectional view of illustrating resin flow near a flag region of lead frame 32 in conventional mold tool 10. As discussed earlier in reference to FIG. 2, as resin 29 flows past conventional window-frame flag having a perpendicular interior edge, boundary-layer separation occurs leaving region 32 void of resin. By employing a tapered edge, such as edge 46, on the inner perimeter of a window-frame flag, resin flow will better conform to the interior flag edge such that a voided region is less likely. Ideally, the degree of taper in edge 46, denoted in FIG. 4 as $\phi$, should closely match the inflection, denoted as $\theta$ of resin 29 as it passes tapered edge 46. Angle $\theta$ will vary depending on the design of mold tool 10 and the design of lead frame 32 and die 38. In general, however, edge 46 should be outwardly tapered such that angle $\phi$ is at least 20°, and more suitably ranges from between 30° and 80°, and is preferably 55° to 65°. The outward taper of edge 46 is such that opening 44 has a smaller perimeter at the top surface of flag 36 than at the bottom surface of the flag.

Figure 5:
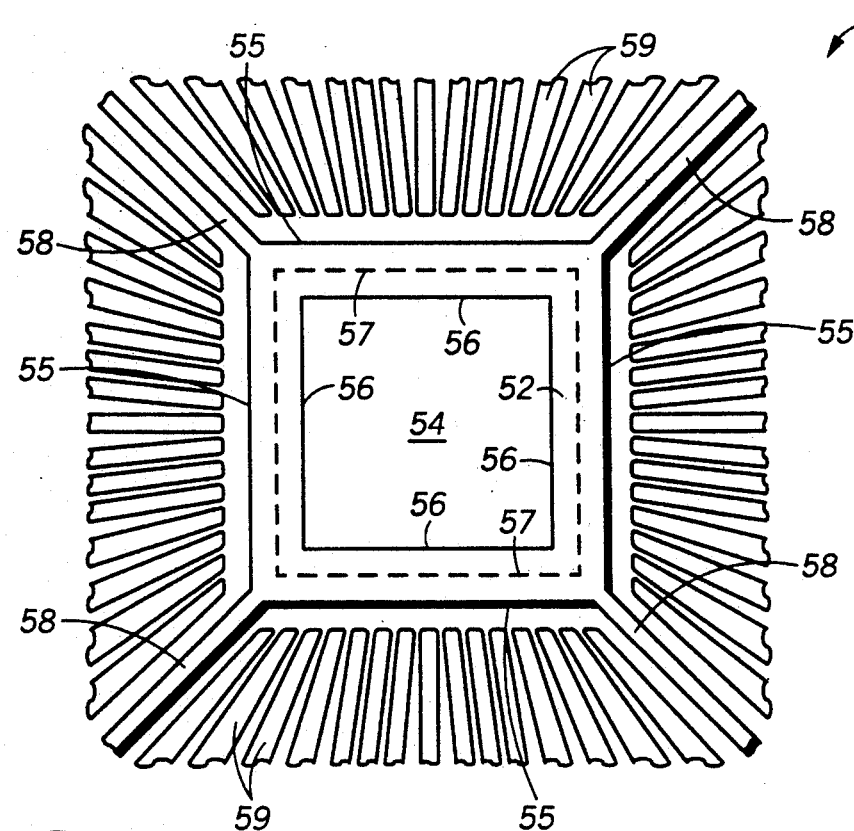
FIG. 5 is a top view of a lead frame suitable for use in a semiconductor device in accordance with the present invention.

FIGS. 5-8 are top views of various lead frame designs suitable for use with a semiconductor device in accordance with the present invention. FIG. 5 partially illustrates a lead frame 50. Lead frame 50 includes a window-frame flag 52 having an opening 54. Exterior edges 55 of flag 52 together define an outer perimeter of the flag, while interior edges 56 created by opening 54 define an inner perimeter of the flag. Flag 52 is held in lead frame 50 by flag support members 58, also known as tie bars. Support members are connected to rails (not illustrated) of the lead frame. Lead frame 50 also includes a plurality of leads 59 that surround flag 52.

Opening 54 in flag 52 should be sufficiently large so that a substantial portion of a semiconductor die surface (not illustrated) is exposed through the opening in order to avoid the previously described problems of package cracking and delamination at an interface between the die and the flag. Typically, the outer perimeter of flag 52 is bigger than a perimeter of a semiconductor die (represented by outline 57), whereas the inner perimeter of the flag is smaller. Upon attaching a semiconductor die to flag 52, a portion of a surface of the die will be exposed through the opening, wherein the area exposed will be equal in size to the area of opening 54. Typically, the surface of the die exposed by the opening is a bottom or non-active surface, as represented in FIG. 3.

In order to minimize the potential for delamination at an interface between a lead frame and a resin package material, thereby reducing the likelihood of package cracking, the area of a die surface exposed by a flag opening should be maximized. While the specific area of an opening will depend upon the size of a flag and the size of a semiconductor die to be attached to the flag, a general rule is that an opening should expose at least 20% of a die surface and preferably exposes at least 60% of a die surface. Therefore, at least 20% of a die surface will be in contact with a resin package body once the die is encapsulated. As stated earlier, the adhesion of a resin packaging material to a die surface is stronger than the adhesion of the resin to a lead frame. Consequently, having 20% or more of a die surface in contact with the packaging material will improve delamination problems. Another method of referencing the size of an opening suitable for use in the present invention is a comparison between the inner and outer perimeters of the flag, thus defining the opening size as a function of the flag size. Preferably, the inner perimeter of the flag is at least one-half the measure of the outer perimeter. However, this relationship may vary depending on the shape of the opening.

Figure 6:
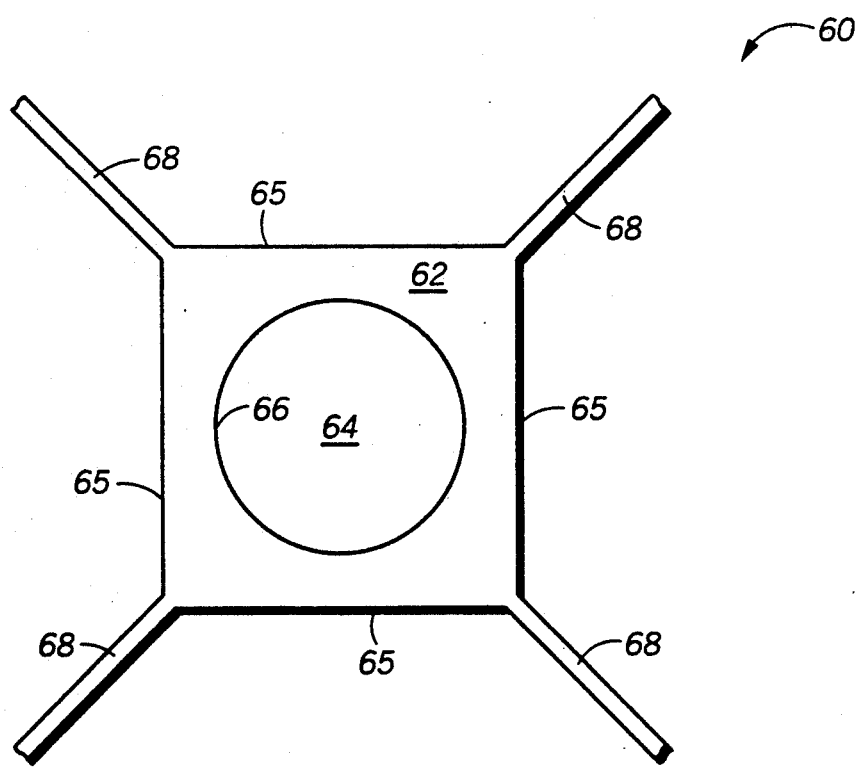
FIG. 6 is a top view of another lead frame suitable for use in a semiconductor device in accordance with the present invention.

Opening 54 is illustrated in FIG. 5 as being square, like flag 52. However, the shape of an opening used in accordance with the present invention is not restricted to a square. FIG. 6 illustrates a lead frame 60 having a window-frame flag 62 supported by tie bars 68. Although lead frame 60 also includes leads, the leads are not illustrated for ease of illustration. An opening 64 formed in flag 62 is circular, as opposed to the previously described square opening. In accordance with the present invention, an interior edge 66 of flag 62 has a tapered edge, although the tapered edge is not apparent in FIG. 6 since the figure is a top view of lead frame 60. An advantage in using a circular opening is a further reduction in the probability of voiding. While outwardly tapered edges help to eliminate voids, there is still a small potential for forming voids in interior corners of a window-frame flag. By making an opening circular, interior corners are eliminated, and therefore corner voiding is not a problem.

Figure 7:
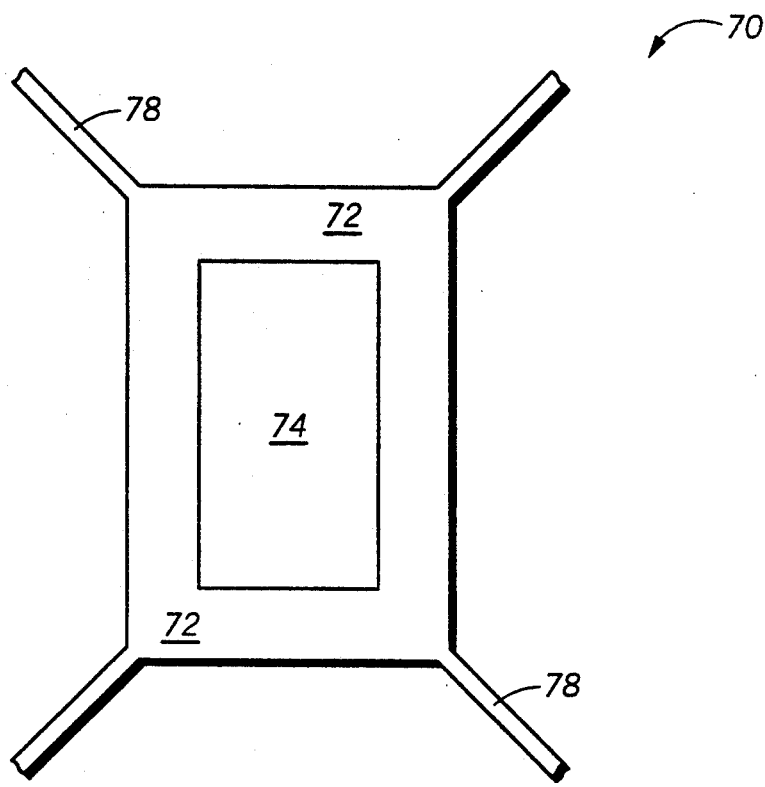
FIGS. 7 and 8 illustrate other suitable shapes for an opening in a flag of a lead frame, in accordance with the present invention.
Figure 8:
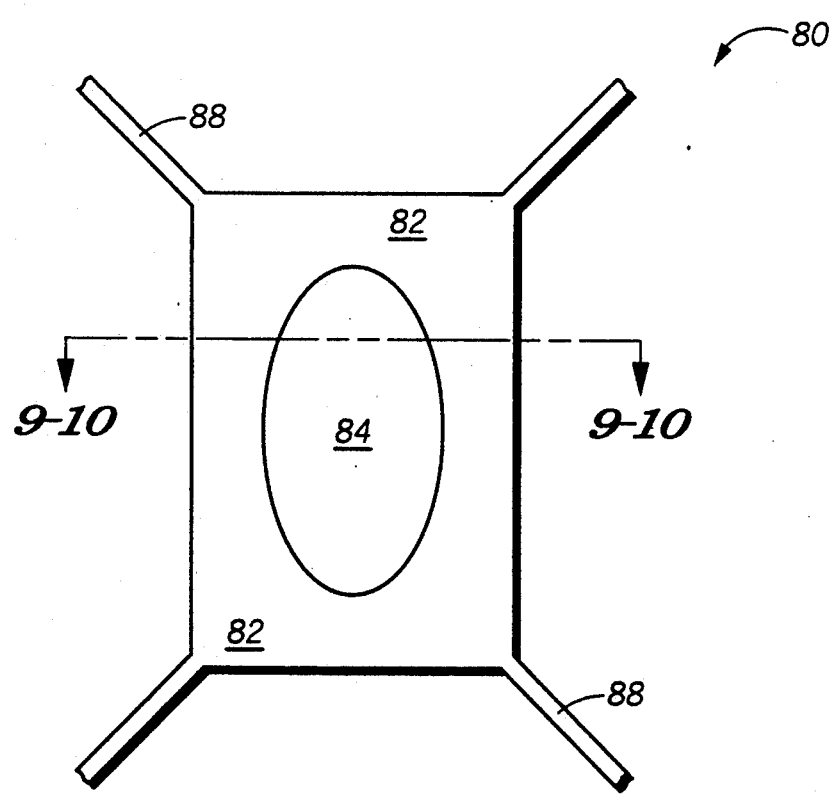

FIGS. 7 and 8 illustrate other suitable opening shapes for use in a lead frame of a semiconductor device in accordance with the present invention. In FIG. 7, a lead frame 70 is partially illustrated. Those portions of the lead frame illustrated are a window-frame flag 72, having an opening 74, and tie bars 78. Flag 72 is rectangular rather than square. Flag shape is usually determined by the shape of a semiconductor die. In other words, square die usually are mounted on square flags while rectangular die are mounted on rectangular flags. Opening 74 in flag 72 is also rectangular. In lead frame 70, a rectangular opening in the flag exposes a larger portion of a semiconductor die surface than if a square opening was used. Exposing the largest possible portion of a die surface through an opening in a flag helps to prevent delamination of a package body. Similarly, a lead frame 80 partially illustrated in a top view in FIG. 8 includes a flag 82 having an elliptical or oval-shaped opening 84. Flag 82 is supported in lead frame 80 by tie bars 88. It is important to note that both lead frames 70 and 80 also include leads; however, the leads are left out of the figures for ease of illustration.

Figure 9:
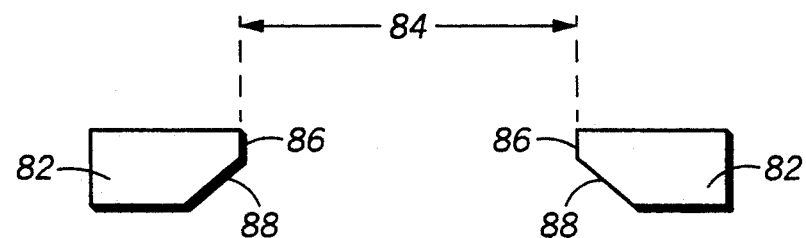
FIG. 9 illustrates a possible cross-sectional view of the lead frame illustrated in FIG. 8, taken along the line 9-10, in accordance with the present invention.

FIG. 9 is an exploded cross-sectional view illustrating a possible configuration of lead frame 80 taken along the line 9-10 of FIG. 8. FIG. 9 illustrates another variation to the present invention in which an interior edge of a flag is not completely tapered. In FIG. 9, flag 82 includes an opening 84 that defines an inner perimeter of the flag. However, the inner perimeter includes two edges, a perpendicular edge 86 and a tapered edge 88. Some lead frame manufacturing techniques used to form tapered edge 88, for example stamping, may form a consequential perpendicular edge or may not be capable of forming one tapered edge between the top and bottom surfaces of the flag. On the other hand, a perpendicular edge may be desired for another reason. Preferably, perpendicular edge 86 is kept as small as possible to avoid the formation of voids near the edge. The edges of flag 82 will lessen the chance of voiding near interior edges of the flag in comparison to conventional window-frame flag lead frames, even though a portion of the inner perimeter of the flag is perpendicular.

Figure 10:
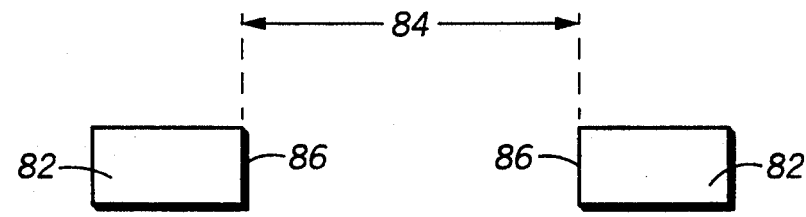
FIG. 10 illustrates another possible cross-sectional view of the lead frame illustrated in FIG. 8, taken along the line 9-10, in accordance with the present invention.

Depending upon the dimensions involved, a round, oval, or elliptic opening having completely perpendicular edges may also sufficiently prevent void formation along interior edges of a flag. FIG. 10 illustrates a perpendicular edge configuration as applied to flag 82 and in accordance with the present invention. FIG. 10 is an exploded cross-sectional view of flag 82 taken along the line 9-10 of FIG. 8. As illustrated in FIG. 10, flag 82 has perpendicular, interior edges 86 but does not include a tapered interior edge. A tapered edge may not be required if the shape of opening 84 is such that the opening does not have sharp corners. For example, round, oval, or elliptic openings do not have corners, and therefore may not need to include an interior tapered edge in order to sufficiently prevent voiding during encapsulation with a resin molding compound. In order for a round, oval or elliptic opening to adequately suppress voiding, it is anticipated that the opening occupy at least 20% of the total flag area, and preferably the opening will occupy at least 50% of the flag area.

The foregoing description and illustrations contained herein demonstrate many of the advantages associated with the present invention. The tapered edge of the flag follows the flow of a resin molding compound so that boundary-layer separation of the resin is minimal. Another advantage is that occurrence of package cracking in a semiconductor device in accordance with the present invention is reduced in comparison to many existing resin encapsulated devices. The reduced package cracking is a result of an increase in the interface area between the resin molding compound and a semiconductor die surface. Another reason semiconductor devices in accordance with the present invention are less susceptible to package cracking is the fact that an interior tapered edge replaces what would otherwise be a sharp corner. Stress in a package body is concentrated most near sharp corners. Eliminating interior sharp corners, either by tapering an interior edge, optimizing shape of an opening in a flag, or both, reduces stress in a package, thereby decreasing the likelihood of cracking the package. As another benefit, the present invention also reduces the probability of a delamination occurring between a die attach epoxy and a lead frame flag by reducing the interface area between these two components.

Thus it is apparent that there has been provided, in accordance with the invention, a semiconductor device having a tapered, window-frame flag, and method for making the same, that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited to any particular type of lead frame material, although the invention is most application to metallic lead frames. Also, the invention in not limited to a specific type of semiconductor die or to a specific method of coupling a semiconductor die to the lead frame. Furthermore, configuration of leads outside a package body can be any configuration known or used throughout the art, including gull-wing, J-lead, and through-hole configurations. In addition, the invention is not limited to using any specific shape for an opening formed in the flag. While a flag of a lead frame used in accordance with the present invention will have only one opening formed therein, the size of the opening can vary in accordance with the previous description. It is also important to note that a lead frame used in accordance with the present invention need not include tie bars as illustrated. Therefore, it is intended that this invention encompass all such variations and modifications as fall within the scope of the appended claims.

We claim:

1. A semiconductor device comprising:
   a lead frame comprising:
   a plurality of leads, each lead having an inner portion and an outer portion; and
   a flag having a top surface, a bottom surface, an outer perimeter, an opening extending through the flag, and an inner perimeter defined by the opening, wherein the inner perimeter has a tapered edge, wherein the tapered edge is tapered in a direction such that the opening is smaller at the top surface than at the lower surface;
   a semiconductor die positioned on the top surface of the flag of the lead frame;
   means for electrically coupling the semiconductor die to the plurality of leads; and
   a resin package body which encapsulates the semiconductor die, the flag, the opening, and inner portions of the plurality of leads.

2. The semiconductor device of claim 1 wherein the flag has only one opening formed therethrough.

3. The semiconductor device of claim 2 wherein the opening in the flag is either rectangular or square.

4. The semiconductor device of claim 2 wherein the opening is either round or elliptic.

5. The semiconductor device of claim 2 wherein the tapered edge of the inner perimeter of the flag is tapered at an angle between approximately 30°–80° as measured between a line normal to the flag and the tapered edge.

6. The semiconductor device of claim 2 wherein the outer perimeter of the flag has a perpendicular edge.

7. A semiconductor device comprising:
   a plurality of leads;
   a quadrilateral die support member having a top surface, a bottom surface, and an outer perimeter;
   an opening extending from the top surface of the die support member to the bottom surface, the opening creating an inner perimeter of the die support member wherein the inner perimeter has a tapered edge, wherein the tapered edge is tapered in a direction such that the opening is smaller at the top surface than at the bottom surface;
   a semiconductor die mounted to the top surface of the die support member, the semiconductor die having a surface which is exposed by the opening in the die support member;
   means for electrically coupling the semiconductor die to the plurality of leads; and
   a resin package body which encapsulates portions of the plurality of leads, the die support member, and the semiconductor die and which fills the opening in the die support member so that the resin package body is in contact with the surface of the semiconductor die exposed by the opening.

8. The semiconductor device of claim 7 wherein the resin package body is in contact with approximately 20% or more of the surface of the semiconductor die.

9. The semiconductor device of claim 7 wherein the die support member has only one opening formed therethrough.

10. The semiconductor device of claim 9 wherein the opening is either rectangular or square.

11. The semiconductor device of claim 9 wherein the opening is either round or elliptic.

12. The semiconductor device of claim 7 wherein the outer perimeter has a first measure and the inner perimeter has a second measure which is equal to at least one-half the first measure.

13. A semiconductor device comprising:
   a plurality of leads;
   a quadrilateral die support member having a top surface, a bottom surface, an outer perimeter, and an area within the outer perimeter;
   one and only one opening extending from the top surface of the die support member to the bottom surface, the opening being either round or elliptic and creating an inner perimeter of the die support member, wherein the opening occupies at least 50% of the die support area and wherein the inner perimeter has a tapered edge extending from the top surface of the die support member to the bottom surface and tapered in a direction which makes the opening smaller at the top surface than at the bottom surface;
   a semiconductor die mounted to the top surface of the die support member, the semiconductor die having a surface which is exposed by the opening in the die support member;
   means for electrically coupling the semiconductor die to the plurality of leads; and
   a resin package body which encapsulates portions of the plurality of leads, the die support member, and the semiconductor die and which fills the opening in the die support member so that the resin package body is in contact with the surface of the semiconductor die exposed by the opening.

14. The semiconductor device of claim 7 wherein the tapered edge of the inner perimeter of the flag is tapered at an angle equal or greater than approximately 30°, as measured between a line normal to the flag and the tapered edge.

15. The semiconductor device of claim 13 wherein the tapered edge of the inner perimeter of the flag is tapered at an angle equal or greater than approximately 30°, as measured between a line normal to the flag and the tapered edge.

* * * * *